United States Patent
Pham et al.

(10) Patent No.: US 10,643,882 B2
(45) Date of Patent: May 5, 2020

(54) CERAMIC RING WITH A LADDER STRUCTURE

(71) Applicant: PIOTECH CO., LTD., Shenyang (CN)

(72) Inventors: Xuyen Pham, Shenyang (CN); Zhi Chai, Shenyang (CN); Shicai Fang, Shenyang (CN)

(73) Assignee: PIOTECH CO., LTD., Shenyang (CN)

( * ) Notice: Subject to any disclaimer, the term of this patent is extended or adjusted under 35 U.S.C. 154(b) by 0 days.

(21) Appl. No.: 15/680,510

(22) Filed: Aug. 18, 2017

(65) Prior Publication Data

US 2018/0053682 A1  Feb. 22, 2018

(30) Foreign Application Priority Data

Aug. 22, 2016  (CN) .......................... 2016 1 0695640

(51) Int. Cl.
*H01L 21/687* (2006.01)

(52) U.S. Cl.
CPC .. *H01L 21/68735* (2013.01); *H01L 21/68785* (2013.01)

(58) Field of Classification Search
None
See application file for complete search history.

(56) References Cited

U.S. PATENT DOCUMENTS

| | | | | |
|---|---|---|---|---|
| 5,198,885 A | * | 3/1993 | Ibrahim | C23C 14/042 118/723 VE |
| 5,728,254 A | * | 3/1998 | Jeng | C23C 14/042 430/22 |

* cited by examiner

*Primary Examiner* — Jethro M. Pence
(74) *Attorney, Agent, or Firm* — Locke Lord LLP; Tim Tingkang Xia, Esq.

(57) ABSTRACT

A ceramic ring for supporting a wafer, comprising: a body; and an annular recess provided in the center of the body, the annular recess having a bottom surface and a buffer portion extending upwards from the bottom surface to the surface of the body. The ceramic ring can ensure reliability in positioning the wafer, and can prevent the edge side of the wafer from generating particles by contacting the ceramic ring.

2 Claims, 7 Drawing Sheets

CERAMIC RING WITH A LADDER STRUCTURE

RELATED APPLICATIONS

This application claims priority to Chinese Application Serial Number 201610695640.8, filed on Aug. 22, 2016, which is incorporated by reference herein in its entirety.

BACKGROUND OF THE INVENTION

Field of the Invention

The present invention relates to a new type of ceramic ring with a ladder structure. The ceramic ring described herein is mainly used in the semiconductor thin film deposition process and pertains to the technical field relating to semiconductor thin film processing equipments and applications.

Background

During the semiconductor thin film deposition process, it requires mechanical arms to place a wafer on a ceramic ring in a reaction chamber to perform the deposition. However, with the existing ceramic ring supporting structure, when the wafer is placed on the ceramic ring and the sidewall thin film deposition surface of the wafer contact the ceramic ring, a lot of particles may be directly produced during collisions between the wafer and the ring due to interfering factors such as the levelness of the ceramic ring or vibrations occurred to it. Therefore, the yield rate of the product can be affected.

Figure 1:
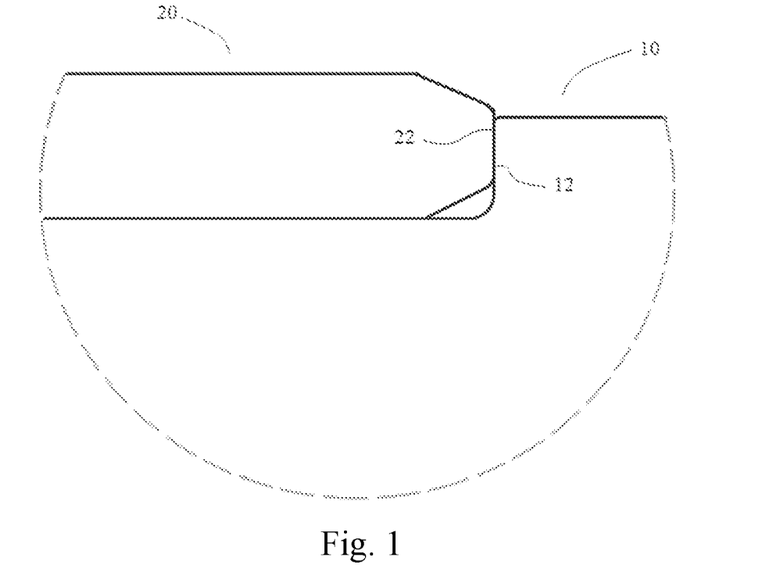
FIG. 1 shows partial details of a wafer placed on a common ceramic ring.

FIG. 1 shows partial details of a wafer placed on a common ceramic ring. As shown in the figure, when interfering factors such as the levelness of the ring or vibrations affect the process, the sidewall thin film deposition surface 22 of the wafer 20 and the groove edge 12 of the ceramic ring 10 will contact, which may cause the contact surface to directly produce more particles during the collisions.

Therefore, to prevent the contact between the sidewall thin film deposition surface of the wafer and the ceramic ring, a ceramic ring that can ensure reliability in positioning and prevent the contact between the thin film deposition surface of a wafer and a ring cavity is needed.

SUMMARY OF THE INVENTION

To solve the above problems, an object of the present invention is to provide a ceramic ring that can prevent contact between the thin film deposition surface of the wafer and the ring cavity.

Another object of the present invention is to provide a ceramic ring that can ensure reliability in positioning and prevent the contact between the thin film deposition surface of the wafer and the ring cavity.

To achieve the above objects, the present invention provides a ceramic ring for supporting a wafer, comprising: a body; and an annular recess provided in the center of the body; the annular recess has a bottom surface and a buffer portion extending upward from the bottom surface to the surface of the body.

In a preferred embodiment of the present invention, the buffer portion is formed in an arc shape.

In a preferred embodiment of the present invention, the buffer portion consists of at least one slope surface portion and at least one arc surface portion.

In a preferred embodiment of the present invention, the wafer has a bottom side and an edge side; a slope side is disposed between the bottom side and the edge side; a junction of the slope side and the edge side forms an arc surface; and the slope side and an extending plane of the bottom side define a wafer slope side angle.

In a preferred embodiment of the present invention, the buffer portion of the ceramic ring has a first slope surface and a second slope surface; the bottom surface connects to the first slope surface; the first slope surface connects to the second slope surface; the second slope surface connects to the surface of the body; the first slope surface and the extending plane of the bottom surface define a first slope surface angle; and an extending plane of the second slope surface and the extending plane of the bottom surface define a second slope surface angle, wherein the first slope surface angle is smaller than the wafer slope side angle, and the wafer slope side angle is smaller than the second slope surface angle.

In a preferred embodiment of the present invention, a junction of the bottom surface and the first slope surface of the ceramic ring forms an arc surface; a junction of the first slope surface and the second slope surface of the ceramic ring forms an arc surface; and a junction of the second slope surface and the surface of the body of the ceramic ring forms an arc surface.

The aforementioned aspects and other aspects of the present invention will be better understood by reference to the following detailed description of the non-limiting exemplary embodiments and the accompanying drawings.

DETAILED DESCRIPTION OF THE PREFERRED EMBODIMENTS

Figure 2:
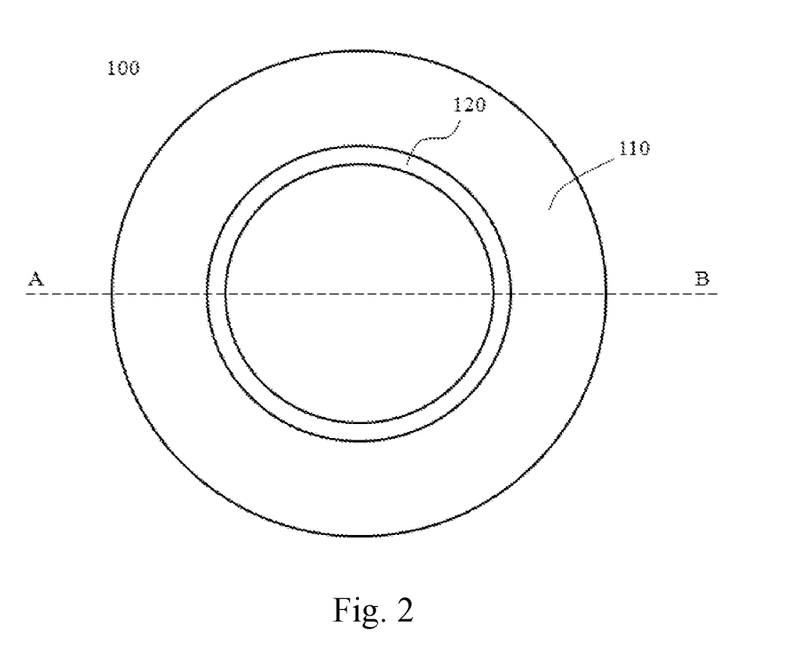
FIG. 2 is a top view of the ladder-structured ceramic ring according to the present invention.

FIG. 2 is a top view of a ceramic ring with a ladder structure according to the present invention. As shown in the figure, a ladder-structured ceramic ring 100 comprises a body 110 and an annular recess 120. A wafer is placed on the annular recess 120 when a thin film deposition process is performed.

Figure 3:
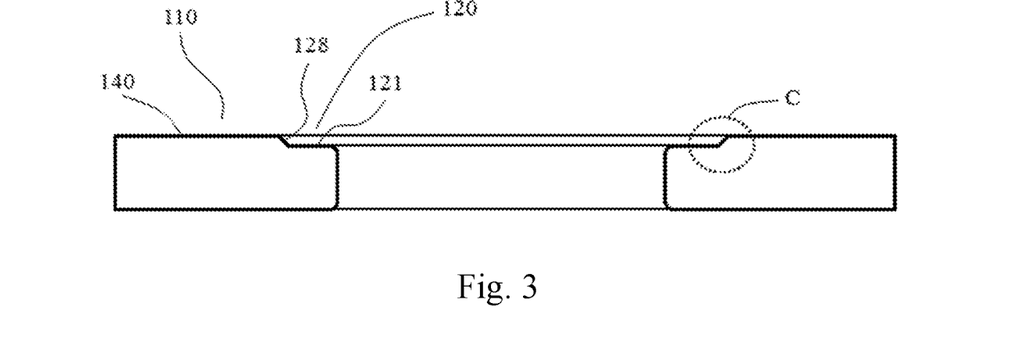
FIG. 3 is a cross-sectional view of the ladder-structured ceramic ring according to the present invention.

FIG. 3 is a cross-sectional view of the ladder-structured ceramic ring according to the present invention; the cross section is taken along line AB as illustrated in FIG. 1. As shown in FIG. 3, the annular recess 120 for placing the wafer is formed in a groove shape so as to secure the wafer and ensure the wafer positioning reliability. The annular recess 120 has a buffer portion 128 and a bottom surface 121. The body 110 has a body surface 140 (the surface of the body).

Figure 4:
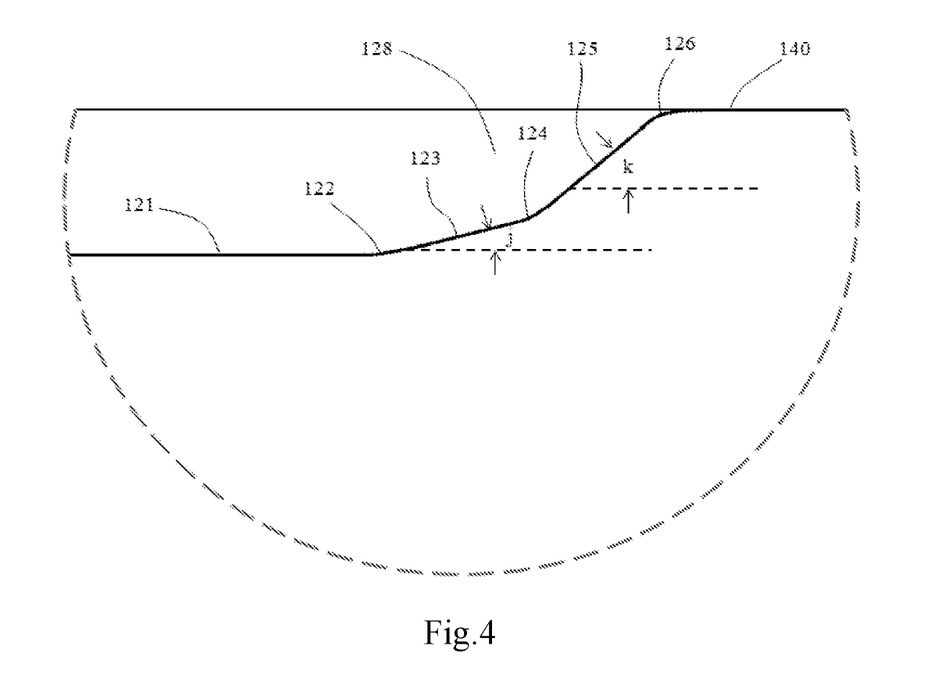
FIG. 4 is a partial detailed view of the ladder-structured ceramic ring according to an embodiment of the present invention.

FIG. 4 is a partial detailed view of the ladder-structured ceramic ring according to an embodiment of the present invention; the partial view shows the portion contained in the dotted circle C as illustrated in FIG. 3. As shown in FIG. 4, the buffer portion 128 has a first slope surface 123 and a second slope surface 125. A first arc surface 122 is disposed between the bottom surface 121 and the first slope surface 123; a second arc surface 124 is disposed between the first slope surface 123 and the second slope surface 125; and a third arc surface 126 is disposed between the second slope surface 125 and the body surface 140. The first slope surface 123 and the extending plane of the bottom surface 121 define a first slope surface angle j; the extending plane of the second slope surface 125 and the extending plane of the bottom surface 121 define a second slope surface angle k. The first slope surface angle j is smaller than the second slope surface angle k.

Figure 5:
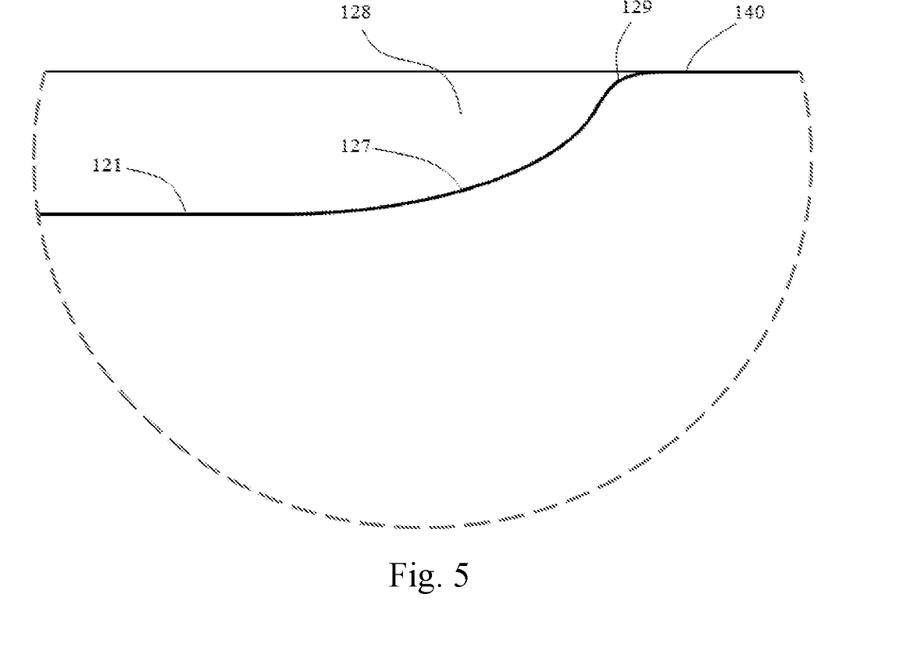
FIG. 5 is a partial detailed view of the ladder-structured ceramic ring according to another embodiment of the present invention.

FIG. 5 is a partial detailed view of the ladder-structured ceramic ring according to another embodiment of the present invention; the partial view shows the portion contained in the dotted circle C as illustrated in FIG. 3. As shown in FIG. 5, the buffer portion 128 is an arc buffer surface 127 formed in an arc shape. The bottom surface 121 connects with the arc buffer surface 127, and an arc surface 129 is disposed between the arc buffer surface 127 and the body surface 140.

Figure 6:
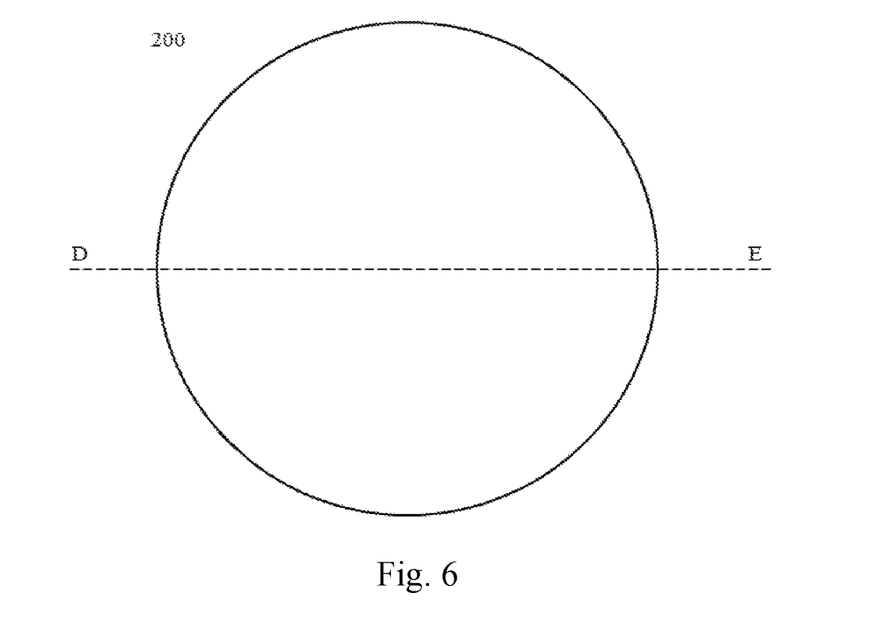
FIG. 6 is a top view of a wafer according to the present invention.
Figure 7:
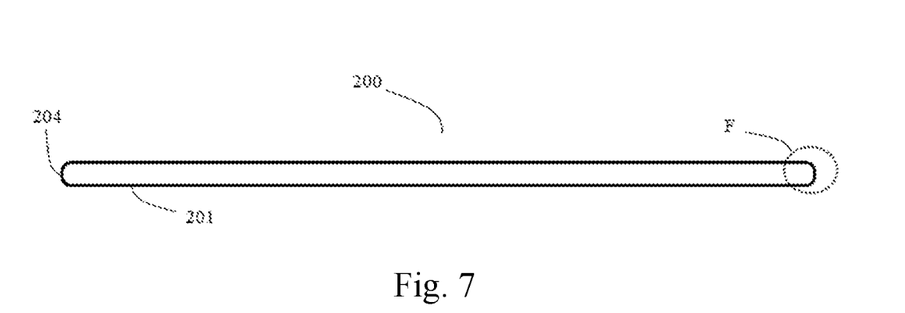
FIG. 7 is a cross-sectional view of the wafer according to the present invention.
Figure 8:
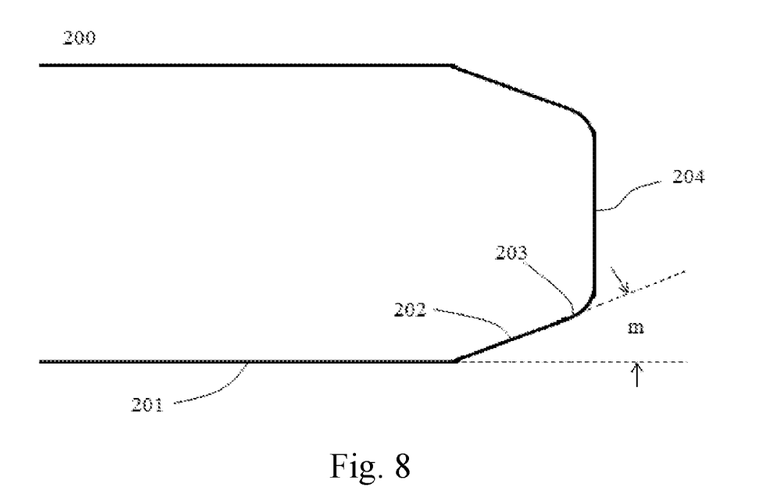
FIG. 8 is a partial view of the wafer according to an embodiment of the present invention.

Please refer to FIGS. 6, 7 and 8. FIG. 6 is a top view of a wafer according to the present invention. A wafer 200 is placed on the ladder-structured ceramic ring 100 when a thin film deposition process is performed. FIG. 7 is a cross-sectional view of the wafer according to the present invention; the cross-section is taken along line DE as illustrated in FIG. 6. As shown in FIG. 7, the wafer 200 has a bottom side 201 and an edge side 204. FIG. 8 is a partial view of the wafer according to the present invention; the partial view shows the portion contained in the dotted circle F as illustrated in FIG. 7. As can be seen in FIG. 8, a slope side 202 is disposed between the bottom side 201 and the edge side 204 of the wafer 200; an arc surface 203 is disposed between the slope side 202 and the edge side 204; and the slope side 202 and the extending plane of the bottom side 201 define a wafer slope side angle m. The wafer slope side angle m is larger than the first slope surface angle j of the ladder-structured ceramic ring 100, and the wafer slope side angle m is smaller than the second slope surface angle k of the ladder-structured ceramic ring 100.

Figure 9:
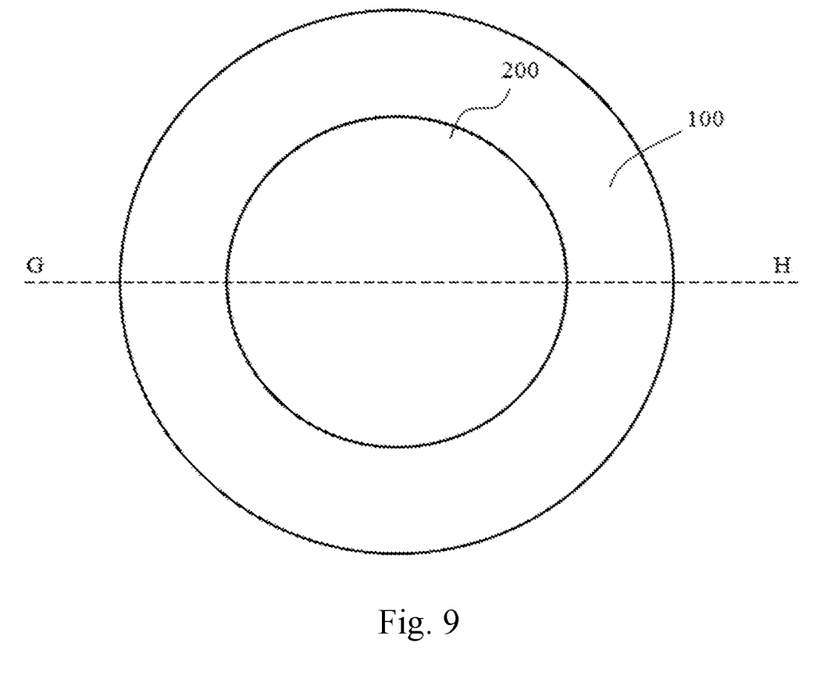
FIG. 9 is a top view of the wafer placed on the ladder-structured ceramic ring.

FIG. 9 is a top view of the wafer placed on the ladder-structured ceramic ring. As shown in the figure, the wafer 200 is placed on the ladder-structured ceramic ring 100 when a thin film deposition process is performed.

Figure 10:
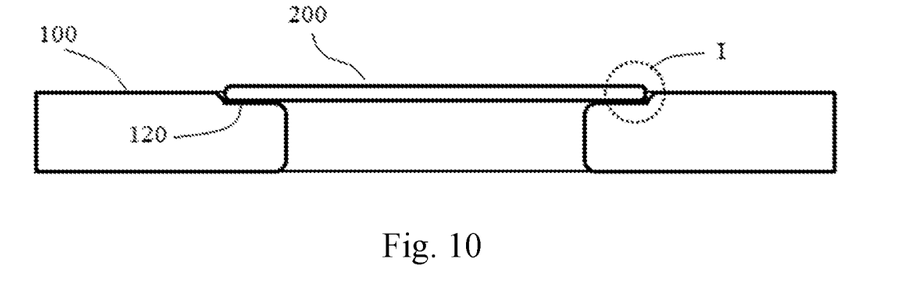
FIG. 10 is a cross-sectional view of the wafer placed on the ladder-structured ceramic ring.

FIG. 10 is a cross-sectional view of the wafer placed on the ladder-structured ceramic ring; the cross-section is taken along line GH as illustrated in FIG. 9. As can be seen in FIG. 10, the wafer 200 is placed on the annular recess 120 of the ladder-structured ceramic ring 100, so that the wafer 200 can be secured.

Figure 11:
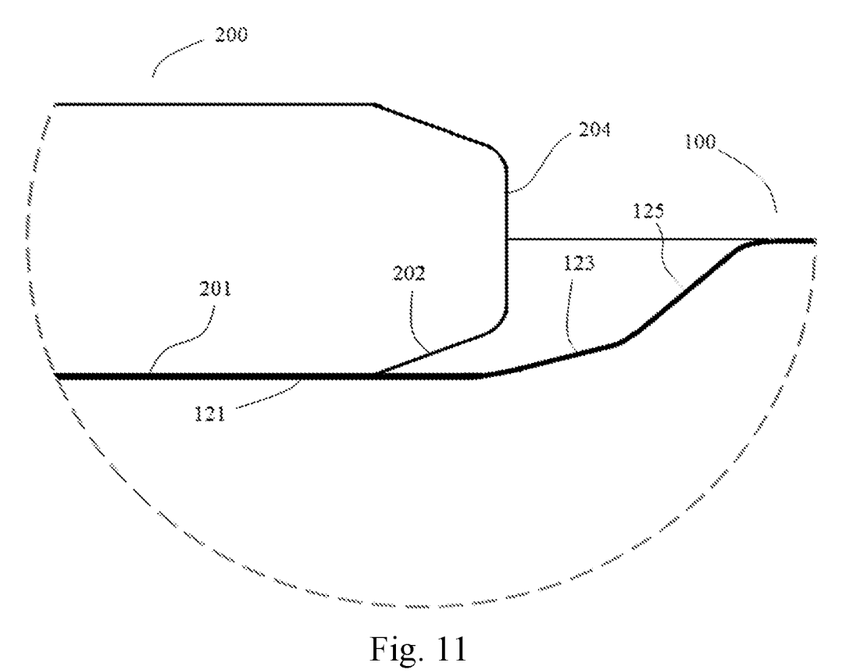
FIG. 11 is a partial detailed view of the wafer placed on the ladder-structured ceramic ring according to an embodiment.

FIG. 11 is a partial detailed view of the wafer placed on the ladder-structured ceramic ring according to an embodiment; the partial view shows the portion contained in the dotted circle I in as illustrated in FIG. 10. As shown in FIG. 11, when the wafer 200 is placed on the bottom surface 121 of the ladder-structured ceramic ring 100, the bottom side 201 of the wafer 200 contacts the bottom surface 121 of the ladder-structured ceramic ring 100, but the edge side 204 of the wafer 200 does not contact the ladder-structured ceramic ring 100.

Figure 12:
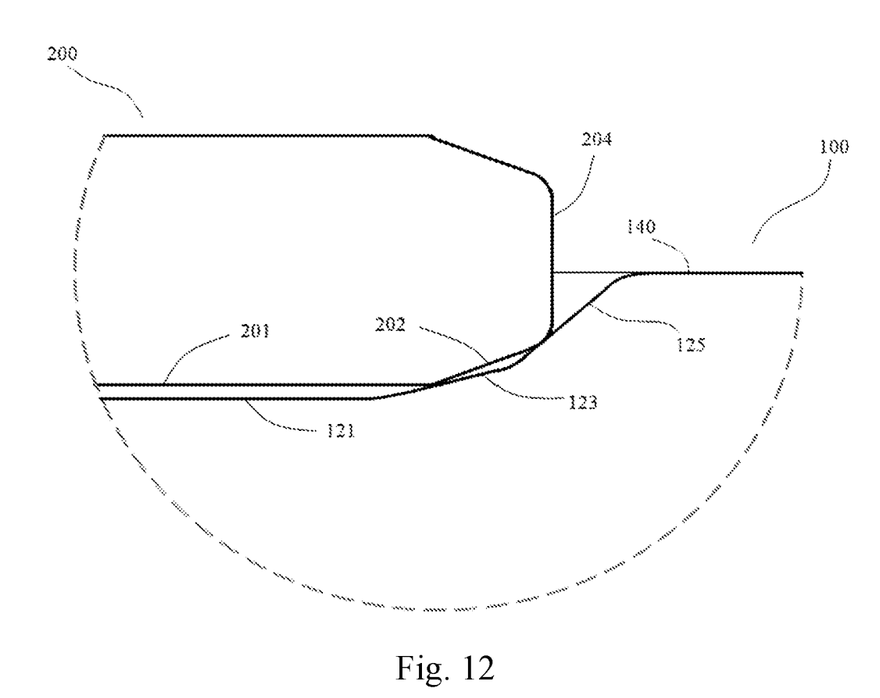
FIG. 12 is a partial detailed view of the wafer offset on the ladder-structured ceramic ring according to an embodiment.

FIG. 12 is a partial detailed view of the wafer displaced from a plane of the ladder-structured ceramic ring according to an embodiment. As shown in the figure, when the wafer 200 is displaced due to factors such as the levelness of the ladder-structured ceramic ring 100 or vibrations occurred thereto, the wafer 200 slides along the first slope surface 123 of the ladder-structured ceramic ring 100. Since the wafer slope side angle m is smaller than the second slope surface angle k of the ladder-structured ceramic ring 100, based on the geometric relationship, the edge side 204 of the wafer 200 will not contact the ladder-structured ceramic ring 100; as a result, the wafer 200 will not produce particles due to collisions.

Figure 13:
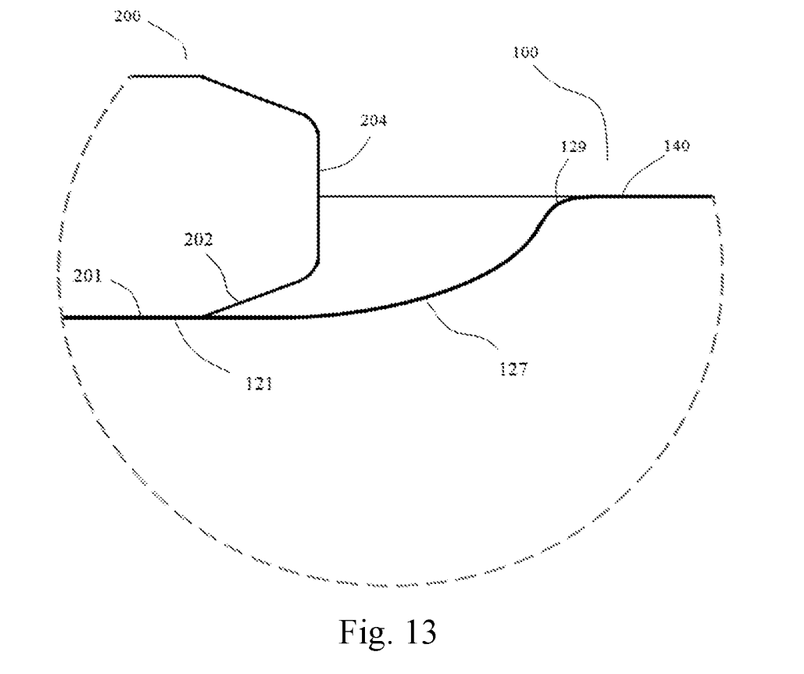
FIG. 13 is a partial detailed view of the wafer placed on the ladder-structured ceramic ring according to another embodiment.

FIG. 13 is a partial detailed view of the wafer placed on the ladder-structured ceramic ring according to another embodiment; the partial view shows the portion contained in the dotted circle I as illustrated in FIG. 10. As shown in FIG. 13, when the wafer 200 is placed on the bottom surface 121 of the ladder-structured ceramic ring 100, the bottom side 201 of the wafer 200 contacts the bottom surface 121 of the ladder-structured ceramic ring 100, but the edge side 204 of the wafer 200 does not contact the ladder-structured ceramic ring 100.

Figure 14:
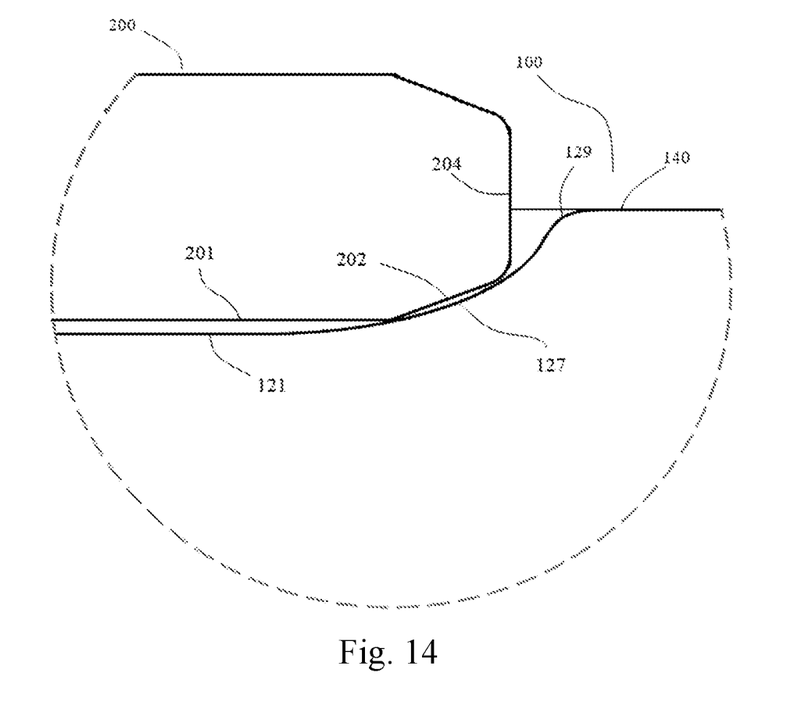
FIG. 14 is a partial detailed view of the wafer offset on the ladder-structured ceramic ring according to another embodiment.

FIG. 14 is a partial detailed view of the wafer offset displaced from a plane of the ladder-structured ceramic ring according to another embodiment. As shown in the figure, when the wafer 200 is displaced due to factors such as the levelness of the ladder-structure ceramic ring 100 or vibrations occurred thereto, the wafer 200 slides along the arc buffer surface 127 of the ladder-structured ceramic ring 100. Since the arc buffer surface 127 is formed in an arc shape, based on the geometric relationship, the edge side 204 of the wafer 200 will not contact the ladder-structured ceramic ring 100; as a result, the wafer 200 will not produce particles due to collisions.

What is claimed is:

1. A ceramic ring for supporting a wafer, comprising:
   a body; and
   an annular recess provided in a center of the body, the annular recess having a bottom surface and a buffer portion extending upward from the bottom surface to a surface of the body;
   wherein the buffer portion of the ceramic ring has a first slope surface and a second slope surface, the bottom surface connects to the first slope surface, the first slope surface connects to the second slope surface, the second slope surface connects to the surface of the body, the first slope surface and an extending plane of the bottom surface define a first slope surface angle, and an extending plane of the second slope surface and the extending plane of the bottom surface define a second slope surface angle;

wherein the wafer has a bottom side and an edge side, a slope side is disposed between the bottom side and the edge side, a junction of the slope side and the edge side forms an arc surface, and the slope side and an extending plane of the bottom side define a wafer slope side angle;

wherein the first slope surface angle is smaller than the wafer slope side angle, and the wafer slope side angle is smaller than the second slope surface angle;

wherein the first slope surface angle is smaller than the second slope surface angle;

wherein the first slope surface and the second slope surface are configured to allow the wafer to slide therebetween; and wherein the edge side of the wafer does not contact the ceramic ring while the wafer is sliding between the first slope surface and the second slope surface.

2. The ceramic ring of claim 1, wherein a junction of the bottom surface of the ceramic ring and the first slope surface thereof forms an arc surface; a junction of the first slope surface of the ceramic ring and the second slope surface thereof forms an arc surface; and a junction of the second slope surface of the ceramic ring and the surface of the body forms an arc surface.

\* \* \* \* \*